United States Patent
Lee et al.

(10) Patent No.: US 7,816,170 B2
(45) Date of Patent: Oct. 19, 2010

(54) DUAL-PIXEL FULL COLOR CMOS IMAGER WITH LARGE CAPACITY WELL

(75) Inventors: Jong-Jan Lee, Camas, WA (US); Jon M. Speigle, Vancouver, WA (US); Douglas J. Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 16 days.

(21) Appl. No.: 12/251,067

(22) Filed: Oct. 14, 2008

(65) Prior Publication Data

US 2009/0194800 A1 Aug. 6, 2009

Related U.S. Application Data

(63) Continuation-in-part of application No. 12/029,431, filed on Feb. 11, 2008, which is a continuation-in-part of application No. 12/025,618, filed on Feb. 4, 2008.

(51) Int. Cl.
*H01L 21/00* (2006.01)

(52) U.S. Cl. .............................. 438/75; 438/57; 438/59; 438/60; 438/73; 257/225; 257/233; 257/288; 257/291; 257/292; 257/293; 257/431

(58) Field of Classification Search ............... 257/222, 257/292, 225, 231, 233, 257, 288, 291–294, 257/431, 435, E31.058, E31.063, E31.121, 257/E27.133, E27.134, E25.002, E25.004, 257/E25.009; 438/57, 59, 60, 73–75, FOR. 424
See application file for complete search history.

(56) References Cited

U.S. PATENT DOCUMENTS

| | | | | |
|---|---|---|---|---|
| 2002/0125513 | A1* | 9/2002 | Inoue | 257/291 |
| 2004/0178478 | A1* | 9/2004 | Shizukuishi | 257/620 |
| 2005/0087829 | A1* | 4/2005 | Merrill et al. | 257/440 |
| 2009/0001427 | A1* | 1/2009 | Adkisson et al. | 257/229 |

OTHER PUBLICATIONS

Younsub Lim et al., "Stratified photodiode a new concept for small size high performance CMOS image sensor pixels," 2007 IEEE Image Sensor Workshop, p. 311-314 (2007).

* cited by examiner

*Primary Examiner*—N Drew Richards
*Assistant Examiner*—Yu-Hsi Sun
(74) *Attorney, Agent, or Firm*—Law Office of Gerald Maliszewski; Gerald Maliszewski

(57) ABSTRACT

A dual-pixel full color CMOS imager comprises a two-photodiode stack including an n doped substrate, a bottom photodiode, and a top photodiode. The bottom photodiode has a bottom p doped layer at a first depth overlying the substrate and a bottom n doped layer cathode overlying the bottom p doped layer. The top photodiode has a top p doped layer overlying the bottom n doped layer and a top n doped layer cathode overlying the top p doped layer. A single photodiode including a bottom p doped layer overlies the substrate at a third depth. The third depth is less than, or equal to the first depth. A bottom n doped layer overlies the bottom p doped layer, a top p doped layer directly overlies the bottom n doped layer without an intervening layer, and a top n doped layer overlies the top p doped layer.

15 Claims, 7 Drawing Sheets

Fig. 1
*(PRIOR ART)*
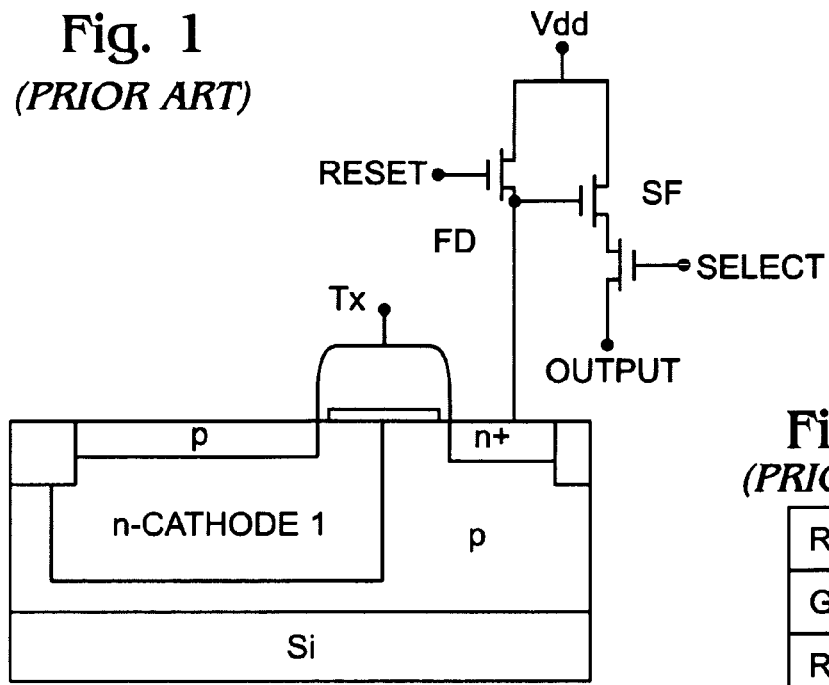
Fig. 3
*(PRIOR ART)*
Fig. 2
*(PRIOR ART)*
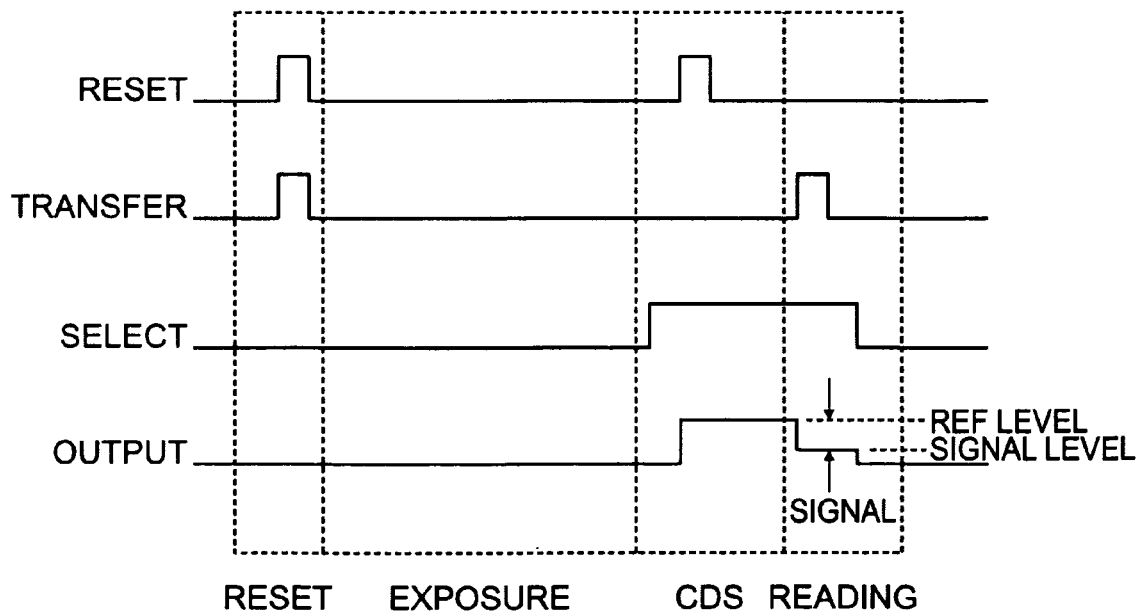

Fig. 5 (PENDING ART)

US 7,816,170 B2

DUAL-PIXEL FULL COLOR CMOS IMAGER WITH LARGE CAPACITY WELL

RELATED APPLICATIONS

The application is a Continuation-in-Part of pending application Ser. No. 12/029,431, entitled FULL COLOR CMOS IMAGER FILTER, invented by Douglas Tweet et al, filed Feb. 11, 2008, which is a Continuation-in-Part of a pending patent application entitled, DUAL-PIXEL FULL COLOR CMOS IMAGER, invented by Lee et al., Ser. No. 12/025,618, filed Feb. 4, 2008. All of the above-mentioned applications are incorporated herein by reference.

BACKGROUND OF THE INVENTION

1. Field of the Invention

This invention generally relates to integrated circuit (IC) fabrication and, more particularly, a dual-pixel full color imager with a large well-capacity single photodiode, and associated fabrication process.

2. Description of the Related Art

FIG. 1 depicts a complementary metal oxide semiconductor (CMOS) imager with a "buried" or "pinned" photodiode (prior art). Conventionally, the image cell circuit includes four transistors and one photodiode. The pixel operation is divided into three main stages: reset, exposure, and reading.

(1) The reset stage: by turning on the reset and transfer (Tx) transistors, the photodiode capacitance is charged to a reset voltage. As for the case of the p+np buried photodiode shown in FIG. 1, the buried cathode (n) is totally depleted and set to the pinned voltage ($V_{pin}$).

(2) The exposure stage: with the absorption of light by the photodiode, electron and hole pairs are generated. The holes fill the depleted acceptor sites in the p-region, and the electrons fill the depleted donor sites in the n-region. The potential of the photodiode cathode decreases as the photoelectrons fills up at the donor sites.

(3) The reading stage: the pixel value is read out by a correlated double sampling (CDS) circuit. First, the select transistor and the reset transistor are turned on, the floating diffusion (FD) is set to high, and the output is set to the reference level. Then, the transfer transistor (Tx) is turned on, the accumulated photo-electrons in the photodiode are transferred to the FD. Photo-charges in FD are converted to the signal voltage by a source follower (SF) and read out as signal voltage level. The signal is constructed by subtracting the reference voltage level from the signal voltage level (see FIG. 2).

FIG. 2 is a timing diagram associated with of the pixel circuit of FIG. 1 (prior art). The advantage of using a buried photodiode in a CMOS imager sensor is that low dark currents may be obtained. If the charge in the buried n-cathode can be completely depleted during the reset, and the signal electrons in the buried n-cathode can be completely transferred, then zero lag and zero reset noise can be achieved. Several device design parameters optimizations, such as low voltage depleted diode, wide transfer transistor, low threshold voltage, and high gate voltage on transfer transistor must be considered to achieve the complete transfer of the signal electrons in the buried n-cathode.

FIG. 3 is a Bayer color filter pattern (prior art). Conventional CMOS and charge-coupled device (CCD) digital image sensors use a standard photodiode or photogate as the photosensing element. In their native state, the photosensing element captures the light signal as black-and-white. In order to perform color imaging, small color filters are placed on top of each photo sensing element. Usually the red, green, and blue (RGB) color filters are arranged in a Bayer pattern, as shown, which alternately samples red, green, and blue pixels.

A required image-processing step for Bayer pattern sensors is interpolation, during which missing data is estimated from neighboring pixel data. Misalignment of the color filter results in color artifacts, and the color filter adds to the cost of the imager. Furthermore, the continuing design pressures to decrease pixel size act to reduce the photodiode sensing area and the signal strength.

One way to prevent the use of color filters and potentially increase the sensing element area is to stack the photo sensing elements (photodiodes). Silicon has characteristic photon absorption lengths that vary with the energy of the photons absorbed. For the wavelengths of 450 nanometers (nm), 550 nm, and 650 nm, the absorption lengths are 0.24 microns (μm), 1.13 μm, and 3.17 μm, respectively. This variation provides an opportunity to fabricate stacked diode junctions at depths that are capable of separating photons of various wavelengths, using standard CMOS manufacturing processes. Various technologies have been applied to this idea over the past 30 years and full color imaging is available in the market place.

With the pixel size continuing to shrink, the CMOS image sensor faces limitations with regard to both low signal to noise ratio (SNR) and low dynamic range (DR). These limitations result in a degradation of image quality and reduction of usable full range of illuminations. Both the DR and maximum SNR can be improved by increasing the well capacity of the pixel.

For the commonly used buried photodiode active pixel sensor (APS) image sensor structure, the well capacity is represented as:

$$Q_{PD} = (V_{pin} - V_{blooming})C_{PD}$$

The blooming voltage is the minimum voltage required for stopping the photoelectrons from overflowing into the substrate during high illumination. Therefore, full well capacity can be increased by either increasing the pin voltage or increasing the PD capacitance. Increasing the pin voltage is not a favorable option because it increases the operating voltage and/or decreases the maximum voltage swing at the floating diffusion.

FIG. 9 is a schematic diagram of a stratified photodiode structure (prior art). As reported by Lim et al., a stratified photodiode structure increases the photodiode capacitance and well capacity. The DN1, the insertion-p, and a portion of the DN2 are implanted using an addition mask.

It would be advantageous if the n doped layers in photodiode could be formed in different processes, using separate masks, to create a photodiode with even more well capacity that the above-mentioned stratified structure.

SUMMARY OF THE INVENTION

The applications cited in the Related-Applications Section, describe a stacked pixel with two photodiodes. The two photodiodes in the stacked pixel naturally have a higher capacitance than the single photodiode structure. Described herein is a modification to a single photodiode structure which significantly increases its capacitance.

Accordingly, a dual-pixel full color CMOS imager is provided. The imager comprises a two-photodiode stack including an n doped substrate, a bottom photodiode, and a top photodiode. The bottom photodiode has a bottom p doped layer overlying the substrate at a first depth and a bottom n doped layer cathode overlying the bottom p doped layer. The top photodiode has a top p doped layer overlying the bottom n doped layer at a second depth and a top n doped layer cathode overlying the top p doped layer. The imager further includes a single photodiode with a bottom p doped layer overlying the substrate at a third depth, where the third depth is less than, or equal to the first depth. A bottom n doped layer overlies the bottom p doped layer, a top p doped layer directly overlies the bottom n doped layer without an intervening layer, and a top n doped layer overlies the top p doped layer.

A first n doped vertical column overlies the bottom p doped layer in the two-photodiode stack, extending to a stack top surface. The first column is adjacent to the bottom n doped layer. A second n doped vertical column overlies the bottom p doped layer in the single photodiode, extending to a single photodiode top surface. The second column is adjacent to the bottom n doped layer and the top n doped layer.

Additional details of the above-described dual-pixel full color imager and an associated fabrication process are provided below.

BRIEF DESCRIPTION OF THE DRAWINGS

FIG. 1 depicts a complementary metal oxide semiconductor (CMOS) imager with a "buried" or "pinned" photodiode (prior art).

FIG. 2 is a timing diagram associated with of the pixel circuit of FIG. 1 (prior art).

FIG. 3 is a Bayer color filter pattern (prior art).

DETAILED DESCRIPTION

Figure 4:
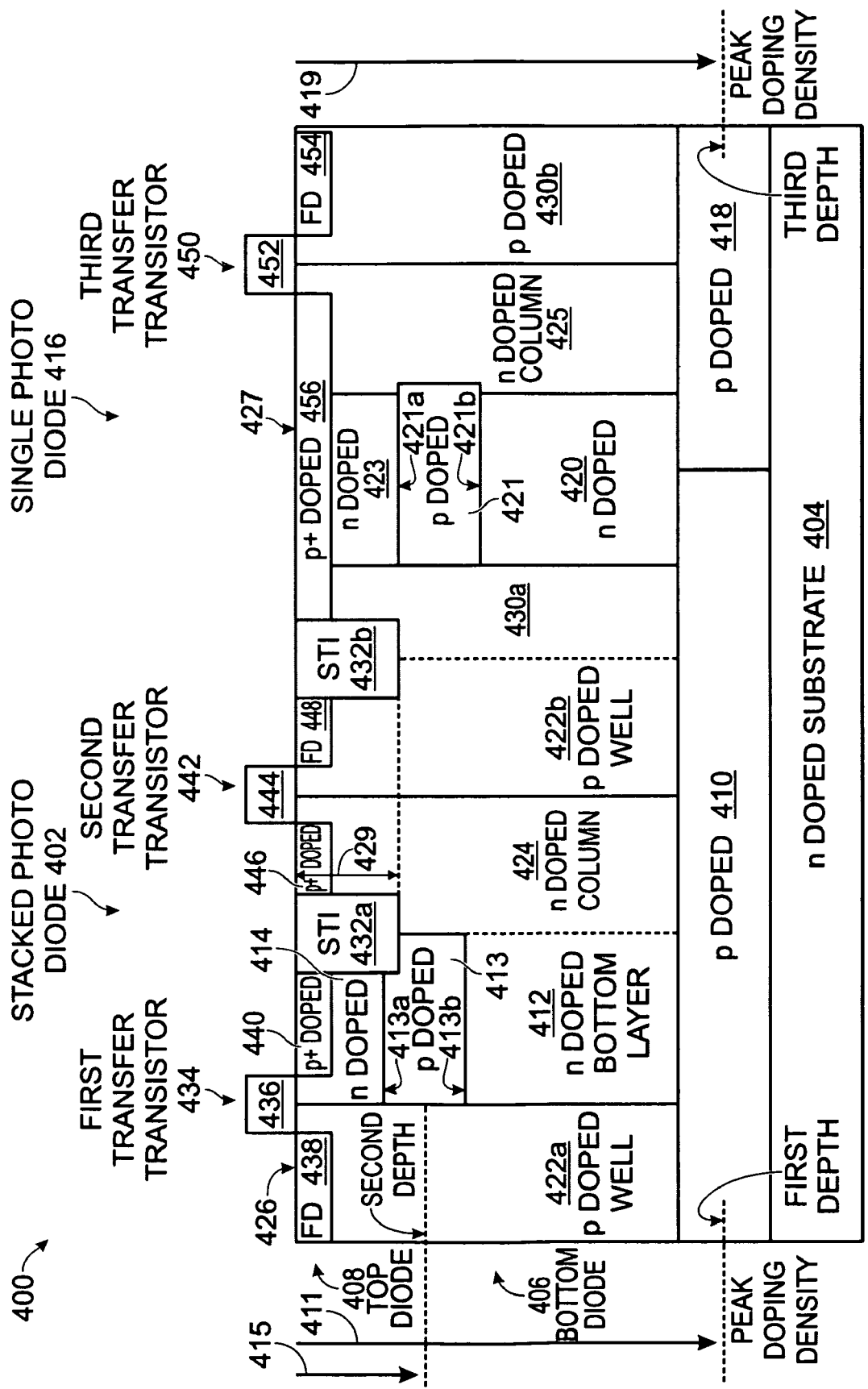
FIG. 4 is a partial cross-sectional view of a dual-pixel full color CMOS imager.

FIG. 4 is a partial cross-sectional view of a dual-pixel full color CMOS imager. The imager 400 comprises a two-photodiode stack 402 including an n doped substrate 404, a bottom photodiode 406, and a top photodiode 408. The bottom photodiode 406 includes a bottom p doped layer 410 overlying the substrate 404 at a first depth 411, and a bottom n doped layer (cathode) 412 overlying the bottom p doped layer 410. The top photodiode 408 has a top p doped layer 413 overlying the bottom n doped layer 412, without an intervening layer, at a second depth 415. A top n doped layer (cathode) 414 overlies the top p doped layer 413.

A single photodiode 416 includes a bottom p doped layer 418 overlying the substrate at a third depth 419, where the third depth is less than, or equal to the first depth. As shown, the first and third depths are about equal. The first depth 411, the second depth 415, and the third depth 419 are defined as the distance from the silicon surface 426 to the locations where the boron has the maximum concentration at the bottom p-doped layer 410 of the two-photodiode stack 402, the top p-doped layer 413 of the two-photodiode stack 402, and the bottom p-doped layer 418 of the single photodiode 416, respectively. A bottom n doped layer 420 overlies the bottom p doped layer 418. A top p doped layer 421 directly overlies the bottom n doped layer 420 without an intervening layer. A top n doped layer 423 overlies the top p doped layer 421. The top p doped layers 413/421 and bottom p doped layers 410/418 in the two-photodiode stack and the single photodiode, respectively, are connected to ground.

A first n doped vertical column 424 overlies the bottom p doped layer 410 in the two-photodiode stack 402, extending to a stack top surface 426, and is adjacent to the bottom n doped layer 412. A second n doped vertical column 425 overlies the bottom p doped layer 418 in the single photodiode, extending to a single photodiode top surface 427, and is adjacent to the bottom n doped layer 420 and the top n doped layer 423.

An n doped region, as defined herein, is associated with dopant concentrations in the range of about $1 \times 10^{15}$ to $5 \times 10^{17}$ $cm^{-3}$, the n+ doped floating diffusion areas have dopant concentrations in the range of about $1 \times 10^{19}$ to $1 \times 10^{21}$ $cm^{-3}$. For the p doped regions, the dopant concentrations are the range of about $5 \times 10^{15}$ to $5 \times 10^{17}$ $cm^{-3}$, and the p+ surface doped regions have the dopant concentrations in the range of about $5 \times 10^{17}$ to $1 \times 10^{19}$ $cm^{-3}$.

A first p well 422a and 422b overlies exterior edges of the bottom p doped layer 410 in the two-photodiode stack, surrounding the top diode 408 and bottom diode 406, and is connected to the top p doped layer 413. A second p well 430a and 430b overlies exterior edges of the single photodiode bottom p doped layer 418, surrounding the single photodiode 416. The first n doped vertical column 424 is adjacent the first p doped well liner 422b. The second n doped vertical column 425 is adjacent the second p doped well liner 430. Although p doped well regions 422b and 430a have been described as separate regions, they may alternately be considered as a single region with a shared wall.

A first shallow trench-isolation (STI) layer 432a has a maximum first depth 429, and is interposed between the top n doped layer 414 in the two-photodiode stack and the first n doped vertical column 424. A second STI layer 432b has the maximum STI depth 429, and is located in the second p well liner 430a. The top p doped layer 413 in the two-photodiode stack has a minimum depth (second depth 415) not less than the STI maximum depth 429. The top p doped layer 413 in the two-photodiode stack has the boundaries 413a and 413b adjacent to the top n-doped layer 414 and bottom n-doped layer 412, respectively. The maximum STI depth 429 is between the top p doped layer 413 two boundaiers, 413a and 413b. The top p doped layer 421 in the single photodiode has a minimum depth (415) not less than the STI maximum depth 429 and equal to the depth of the top p doped layer 413 in the two-photodiode stack. The top p doped layer 421 in the single photodiode has the boundaries 421a and 421b adjacent to the top n-doped layer 423 and bottom n-doped layer 420, respectively. The maximum STI depth 429 is between the top p doped layer 421 two boundaiers, 421a and 421b. A first transfer transistor 434 includes a first gate electrode 436 overlying and interposed between the top n doped layer 414 and a first side of the first p well 422a, an n+ doped floating diffusion (FD) first region 438 overlying the first p well 422, and a p+ doped first surface layer 440 overlying the top n doped layer 414. The p doped first surface layer 440 is connected to the first p doped well 422 and ground. The connections to the first p doped well 422 and ground are not shown.

A second transfer transistor 442 includes a second gate electrode 444 overlying and interposed between a second side of the first p well 422b and the n doped vertical column 424. A p+ doped second surface layer 446 overlies the n doped vertical column 424, and is connected to the first p doped well 422 and ground. The connection between the first p doped well 422 and the p+ doped second surface layer 446 cannot be seen in this view. An n+ floating diffusion region second region 448 overlies the first p well 422b and is connected to the floating diffusion first region 438.

A third transfer transistor 450 includes a third gate electrode 452 overlying and interposed between the top n doped layer 421 and the second p well 430b. An n+ floating diffusion third region 454 overlies the second p well 430 and is connected to the floating diffusion first and second regions 438/448. A p+ doped third surface layer 456 overlies the top n doped layer 421 and second n doped column 425, and is connected to the second p well 430a/430b and ground. These three floating diffusion regions are electrically connected together, so the select, SF, and reset transistors can be shared with these three pixels (see FIG. 5). Therefore, the n+ floating diffusion first region, the n+ floating diffusion second region, and the n+ floating diffusion third region are electrically connected.

In one aspect, the two-photodiode stack bottom photodiode p doped layer first depth 411 is in a range of 1400 to 3000 nanometers (nm), and the two-photodiode stack top photodiode p doped layer second depth 415 is in a range of 500 to 1000 nm. The single photodiode bottom p doped third depth 419 is in a range of 1400 to 3000 nm.

The two-photodiode stack bottom photodiode 406 collects photoelectrons generated in silicon in a range between the first depth 411 and the second depth 415. The two-photodiode stack top photodiode 408 collects photoelectrons generated in silicon in a range between the surface of the two-diode stack 426 and the second depth 415. The single photodiode 416 collects photoelectrons generated in silicon in a range between the surface of the single diode 427 and the third depth 419.

Functional Description

Figure 5:
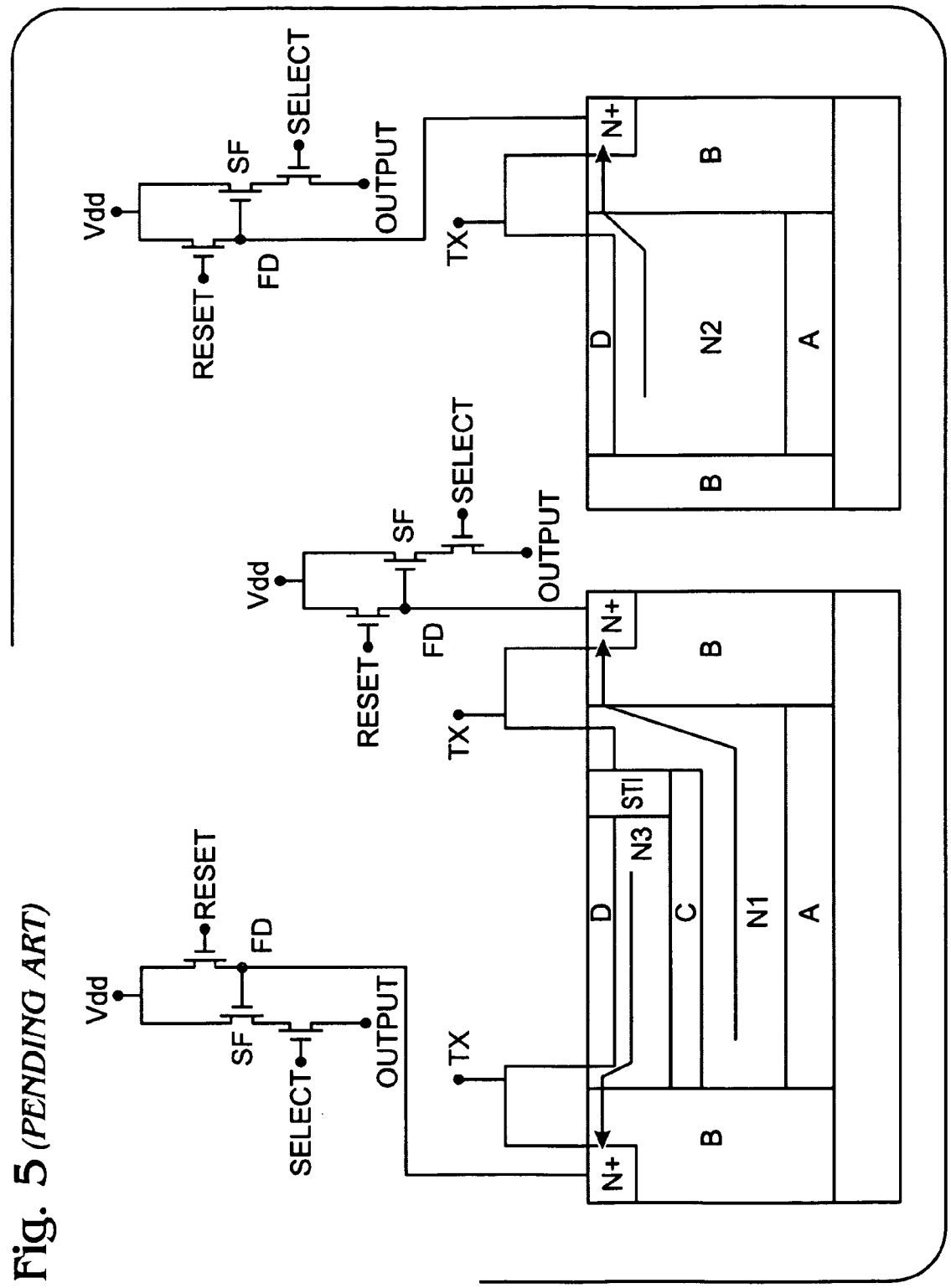
FIG. 5 is a partial cross-sectional view illustrating a stacked photodiode with a single photodiode having one n doped layer (pending art).

FIG. 5 is a partial cross-sectional view illustrating a stacked photodiode with a single photodiode having one n doped layer (pending art). The general process flow is described in parent application Ser. No. 12/029,431, entitled FULL COLOR CMOS IMAGER FILTER, and DUAL-PIXEL FULL COLOR CMOS IMAGER, Ser. No. 12/025,618. The stacked pixel needs "extra" process steps to complete the device structure, as compared to the simpler single pixel. These extra steps include the p-type ion implantation to separate the two photodiodes (C), the n-type dopant to form a cathode for the bottom PD on the stacked diode pixel (N1), and the n-type dopant to form a cathode for the top PD on the stacked diode pixel (N3).

More explicitly, the fabrication steps are as follows:
A: Blanket boron implant to define the depth of the sensor;
B: P-well (boron) implant to isolate the sensor;
C: Boron implant to separate the top and bottom sensors on the stacked PD pixel;
D: Surface boron implant to form buried PD and to reduce dark current:
N1: n-type dopant to form a cathode for the bottom PD on the stacked diode pixel;
N2: n-type dopant to form a cathode on the single PD pixel; and,
N3: n-type dopant to form a cathode for the top PD on the stacked diode pixel.

If the area differences of the three diodes is not considered, the well capacity of the top PD on the stacked PD pixel is about 2 to 3 times larger than the well capacity of the single PD pixel, and the well capacity of the bottom PD on the stacked PD pixel is 1 to 2 times larger than the well capacity of the single PD pixel. Note that the single diode pixel has the same structure as many prior art buried PD image sensor pixels. Therefore, it can be concluded that the two PDs on the stacked PD pixel have larger well capacity than these prior art designs.

Figure 6:
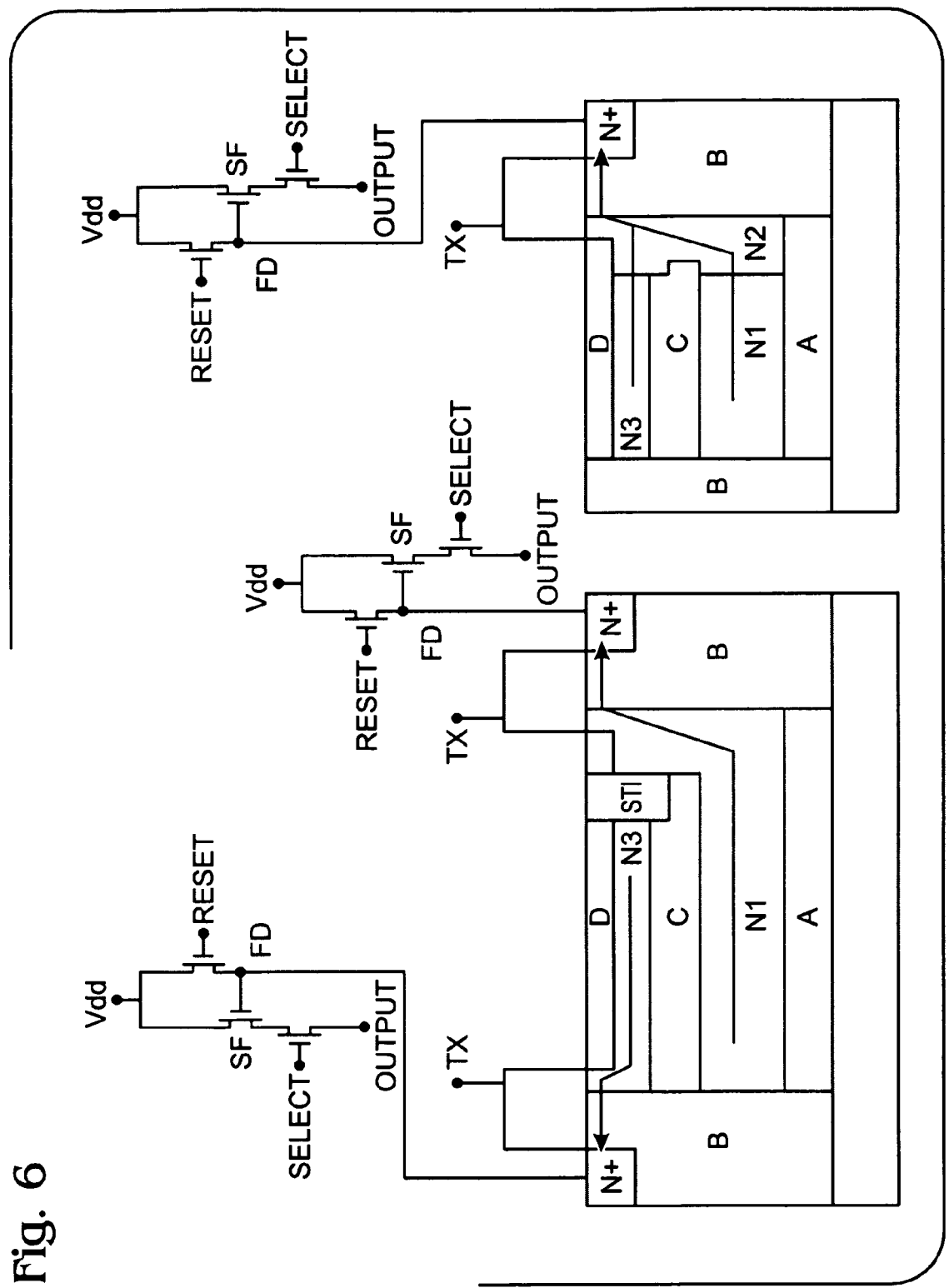
FIG. 6 is a partial cross-sectional view illustrating some steps in the fabrication of the device shown in FIG. 4.

FIG. 6 is a partial cross-sectional view illustrating some steps in the fabrication of the device shown in FIG. 4. The single PD pixel has a 2-3× higher well capacity than the device shown in FIG. 5. The structure does not need any new process steps or masks, in addition to those already needed to fabricate the stacked PD pixel. The increase of well capacity is because the N1 and N3 regions both have shallower depth than N2 (see FIG. 5), so the total dose in N1 and N3 has to be higher than that in N2 in order to sustain the same pinned voltage. In other words, higher total doses in N1 and N3 are needed, so that they are not depleted before reaching the Vpin. The N2 implant is still used in this structure to assist the charge flow from N1 to the transfer gate channel. Similarly, the N2 implant can also be used in the stacked PD pixel to assist the charge transfer from the bottom PD. With the depicted single PD pixel, a high well capacity for all three PDs can be realized.

More explicitly, the fabrication steps are as follows:
A: Blanket boron implant to define the depth of the sensor;
B: P-well (boron) implant to isolate the sensor;
C: Boron implant to separate the top and bottom sensors on the stacked PD pixel;
D: Surface boron implant to form buried PD and to reduce dark current;
N1: n-type dopant to form a cathode for the bottom PD on the stacked diode pixel;
N2: n-type dopant to form a cathode on the single PD pixel; and,
N3: n-type dopant to form a cathode for the top PD on the stacked diode pixel.

A mask (PR mask) is like a negative film (black and white). A wafer is coated with photosensitive material (photoresist) and exposed to a mask pattern printed on the photoresist. If using a positive photoresist, in the regions where the photoresist is exposed (white or transparent in the mask), the resist is removed. In the regions where the photoresist does not get exposed (black in the mask), the resist stays on the wafer. This photolithographic process prints a pattern (of the mask) on the wafer.

In an implant process, multiple implant processes can be performed using a single mask. After implanting, the photoresist is removed, and another photo process starts to apply a new mask starts. In IC industry, the complexity (and cost) of a process depends upon the number of masks required. A photo step is referred to as a photo module. A photo module includes: a photo process, a post photo process such as etching or implanting, and photo resist removal.

Figure 9:
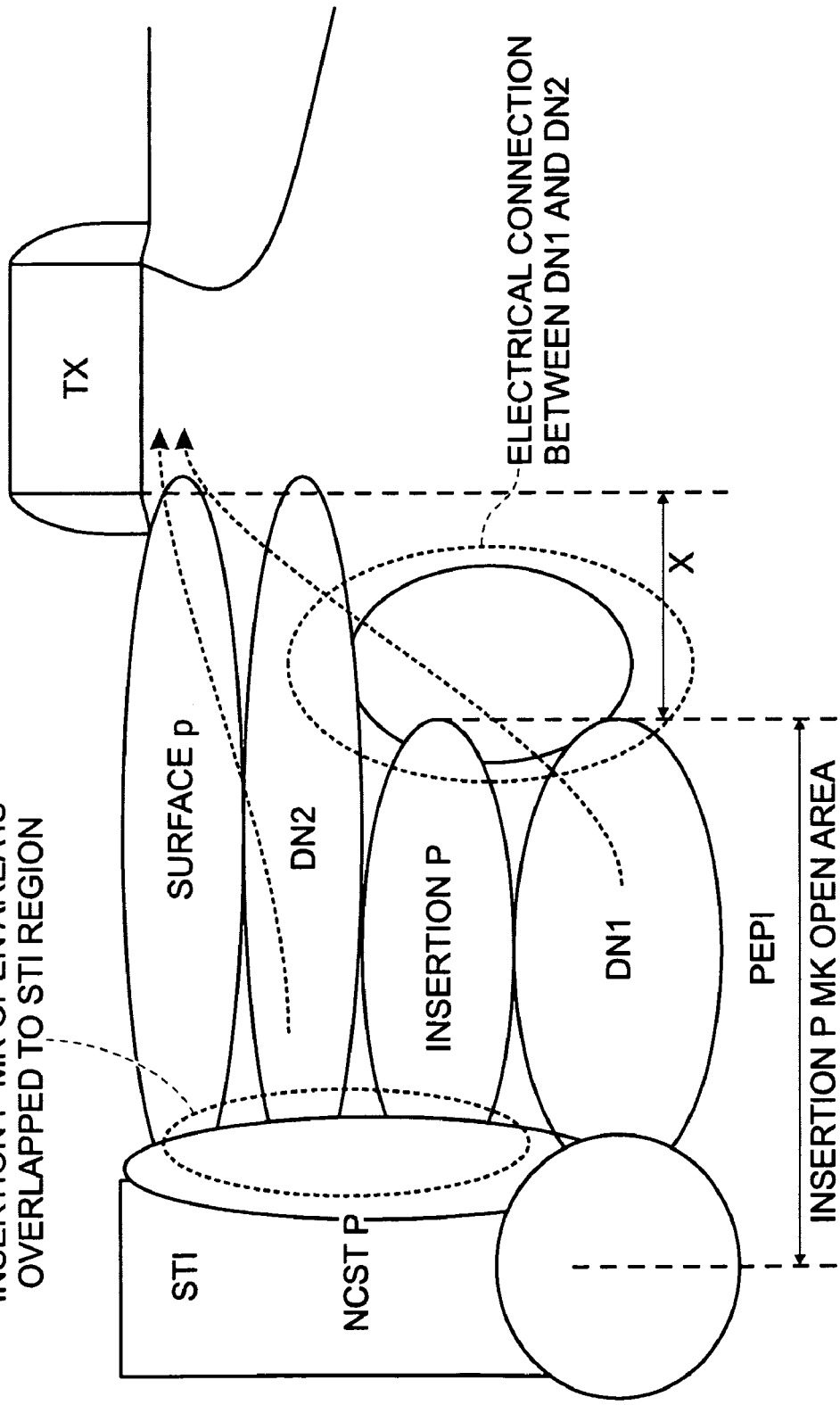
FIG. 9 is a schematic diagram of a stratified photodiode structure (prior art).

The DN1 and DN2 stratified n layers disclosed by Lim (FIG. 9) are performed using the same mask, which is economical. The above-mentioned N1 and N3 steps, performed on the stacked photodiode, are implant processes using different masks, for greater control of the exact regions to be implanted. Pending application DUAL-PIXEL FULL COLOR CMOS IMAGER, invented by Lee et al., Ser. No. 12/025,618, filed Feb. 4, 2008, discloses that a precise dopant density control in N1 and C is necessary to assist charge transfer from N1 to the floating diffusion regions.

Figure 7:
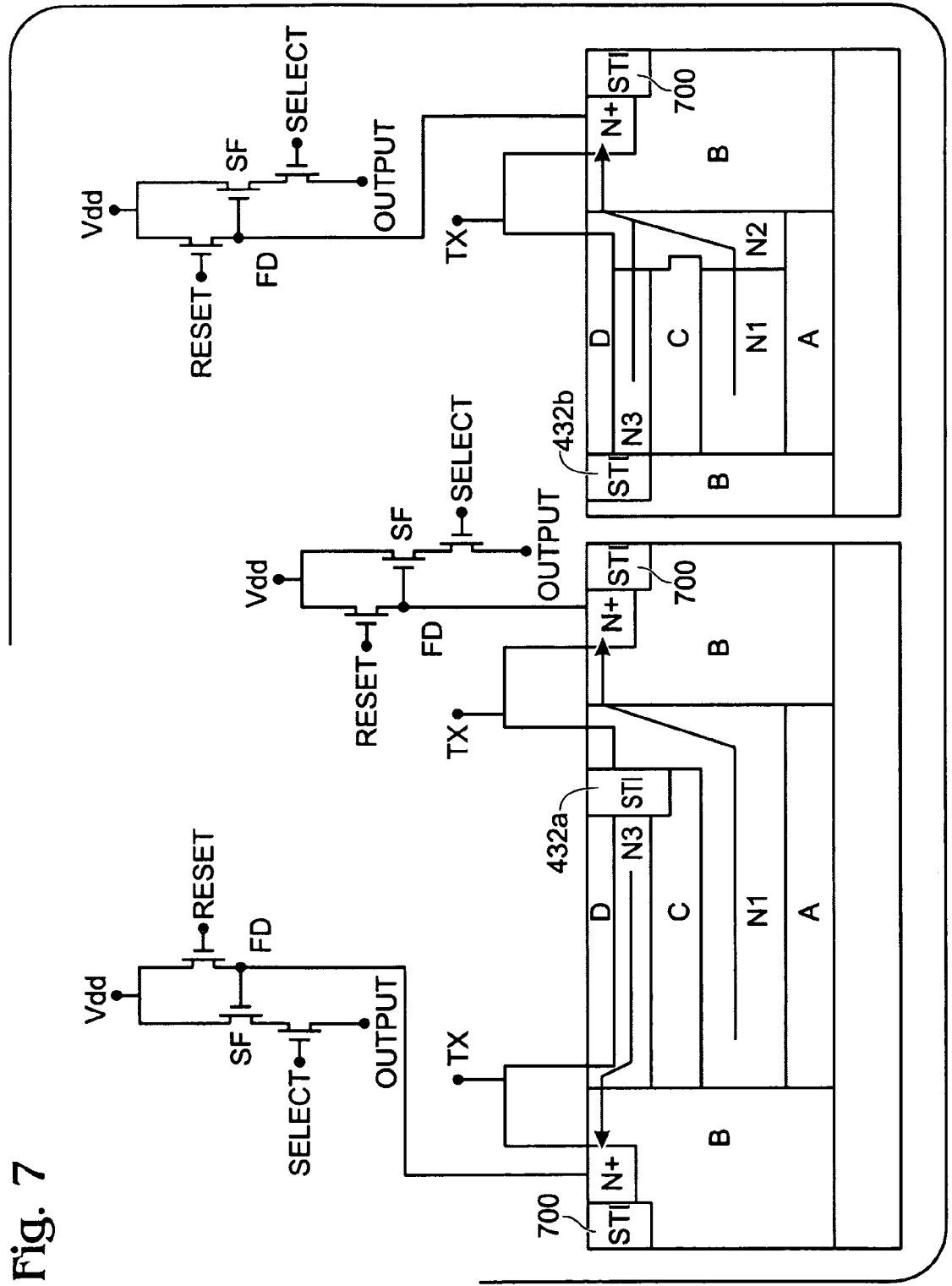
FIG. 7 is a view of the device of FIG. 6 across a different cross-section.

FIG. 7 is a view of the device of FIG. 6 across a different cross-section. FIG. 7 shows STI regions 700, in addition to STI regions 432a and 432b. Typically, all STIs have same depth. Note that the top p doped layers (C) have a depth greater that the maximum penetration of the STI.

Figure 8:
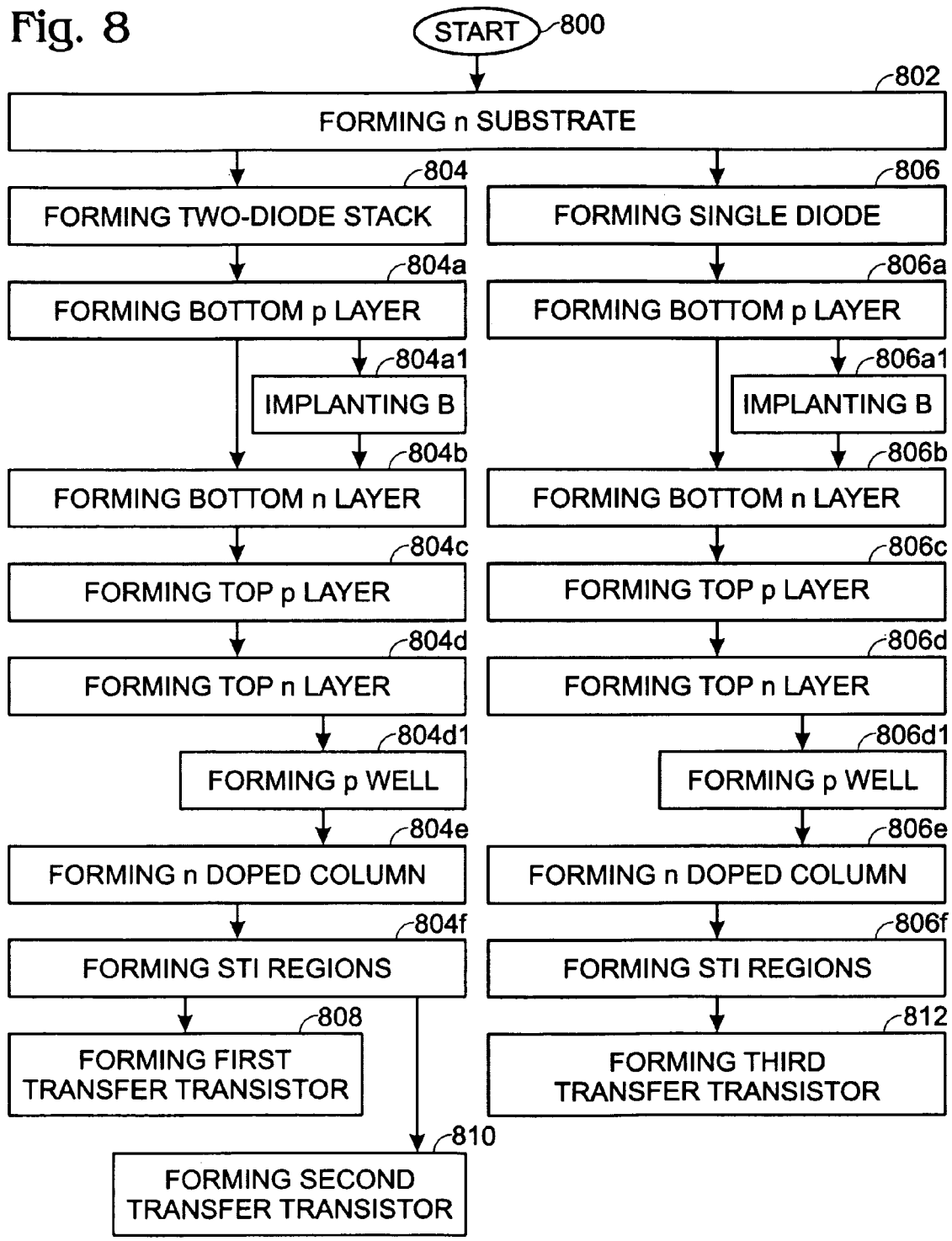
FIG. 8 is a flowchart illustrating a method for forming a dual-pixel full color CMOS imager array.

FIG. 8 is a flowchart illustrating a method for forming a dual-pixel full color CMOS imager array. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 forms an n doped substrate. Step 804 forms a two-photodiode stack including a bottom photodiode with a bottom p doped (804*a*) layer overlying the substrate at a first depth and a bottom n doped layer cathode (804*b*) overlying the bottom p doped layer. The two-diode stack also includes a top photodiode having top p doped layer (804*c*) directly overlying the bottom n doped layer without an intervening layer, at a second depth. A top n doped layer (804*d*) overlies the top p doped layer. Step 806 forms a single photodiode including a bottom p doped layer (806*a*) overlying the substrate at a third depth, where the third depth is less than, or equal to the first depth. A bottom n doped layer (806*b*) overlies the bottom p doped layer, and a top p doped layer (806*c*) directly overlies the bottom n doped layer without an intervening layer, and a top n doped layer (806*d*) overlies the top p doped layer. As explained in the description of FIG. 6, and explained below, portions of Steps 804 and 806 are performed simultaneously.

In one aspect, forming the bottom p doped layers (804*a*/806*a*) in the single photodiode and two-photodiode stack includes substeps. Simultaneously in concurrent processes, boron (B) is implanted to form the two-photodiode stack bottom p doped layer in a first region (804*a*1) of the substrate and the single photodiode bottom p doped layer (806*a*1) in a second region of the substrate. In this aspect, the first depth is equal to the third depth.

In another aspect, Step 804*d*1 forms a first p well overlying exterior edges of the two-photodiode stack bottom p doped layer, surrounding the top and bottom photodiodes and connected to ground. Step 806*d*1 forms a second p well overlying exterior edges of the single photodiode bottom p doped layer, surrounding the single photodiode and connected to ground.

In one aspect, forming the bottom n doped layers in the single photodiode (806*b*) and two-photodiode stack (804*b*) includes simultaneously forming the bottom n doped layer in the same process using a first mask. Forming the top n doped layer in the two-photodiode stack (804*d*) and the single photodiode (806*d*) includes simultaneously forming the top n doped layers in the same process using a second mask. Forming the top p doped layer in the two-photodiode stack (804*c*) and the single photodiode (806*c*) includes simultaneously forming the top p doped layers in the same process using a third mask.

In one aspect, Step 804*e* forms a first n doped vertical column adjacent the first p well, extending from the two-photodiode bottom p doped layer to a stack top surface. The first column is adjacent to the bottom n doped layer. Step 806*e* forms a second n doped vertical column adjacent the second p well, extending from the single photodiode bottom p doped layer to a single photodiode top surface. The second column is adjacent to the bottom n doped layer and the top n doped layer. In another aspect, the first and second n doped columns are formed in the same process using a fourth mask.

In one aspect, Step 804*f* forms a first shallow trench isolation (STI) region having a maximum STI depth, interposed between the top n doped layer in the two-photodiode stack and the first n doped vertical column. Step 806*f* forms a second STI layer having the maximum STI depth, located in the second p well. Forming the top p doped layer in the two-photodiode stack (804*c*) includes forming a top p doped layer having a minimum depth not less than the STI maximum depth, and forming the top p doped layer in the single photodiode (806*c*) includes forming a top p doped layer having a minimum depth not less than the STI maximum depth and equal to the depth of the top p doped layer in the two-photodiode stack. Typically, Step 804*f* and 806*f* are performed at the same time.

In one aspect, simultaneously implanting boron to form the bottom p doped layer in a first region (804*a*) of the substrate and the bottom p doped layer in a second region (806*a*) of the substrate includes multiple blanket implantations, where higher boron doses are used with higher implantation voltages, to form a dosage gradient in the bottom p doped layers. For example, a first implantation may be performed into the bottom p doped layers at a first voltage level and a first dosage. A second implantation is then performed into the bottom p doped layers with a second voltage level, less that the first voltage level, and a second dosage, less than the first dosage. As a result, the first depth can be made greater than the third depth. In some aspects, the first depth in a range between 1400 and 3000 nm, and the third depth is less than the first depth.

In another aspect, Step 808 forms a first transfer transistor overlying the two-photodiode stack connected to the top photodiode. Step 810 forms a second transfer transistor overlying the two-photodiode stack connected to the bottom photodiode. Step 812 forms a third transfer transistor overlying the single photodiode. Forming the first, second, and third transfer transistors includes implanting boron, forming a p doped first surface layer overlying the top n doped layer of the two-photodiode stack and connected to the first p doped well and ground. A p doped second surface layer is formed overlying the first n doped column and connected to the first p doped well and ground. A p doped third surface layer is formed overlying the single photodiode top n doped layer and second n doped column, and connected to ground.

A dopant such as As, P, or a combination of As and P, may be used to form an n+ doped floating diffusion first region overlying the first p well, an n+ floating diffusion second region overlying the first p well, and an n+ floating diffusion third region overlying the second p well. As explained above, the floating diffusion first, second, and third regions are connected together (electrically).

More specifically, Step 808 forms a first gate electrode overlying and interposed between the floating diffusion first region and the first p doped surface layer. Step 810 forms a second gate electrode overlying and interposed between the floating diffusion second region and the p doped second surface layer. Step 812 forms a third gate electrode overlying and interposed between the floating diffusion third region and the p doped third surface layer.

In one aspect, forming the two-photodiode stack bottom photodiode p doped layer at the first depth (804*a*) includes forming the first depth in a range of 1400 to 3000 nanometers (nm). Forming the two-photodiode stack top photodiode p doped layer second depth (804*c*) includes forming the second depth in a range of 500 to 1000 nm. Forming the single photodiode bottom p doped third depth (806*a*) includes forming the third depth is in a range of 1400 to 3000 nm.

A dual-pixel full color CMOS imager has been presented. Examples of explicit structural details and process steps have been provided to illustrate the invention. However, the invention is not limited to just these examples. Other variations and embodiments of the invention will occur to those skilled in the art.

We claim:

1. A method for forming a dual-pixel full color complementary metal oxide semiconductor (CMOS) imager, the method comprising:
   forming an n doped substrate;
   forming a two-photodiode stack including:
      a bottom photodiode with a first bottom p doped layer overlying the substrate at a first depth and a first bottom n doped layer cathode overlying the first bottom p doped layer;
      a top photodiode having a first top p doped layer directly overlying the first bottom n doped layer without an intervening layer, at a second depth, and a first top n doped layer overlying the first top p doped layer;
   forming a single photodiode including a second bottom p doped layer overlying the substrate at a third depth, where the third depth is less than, or equal to the first depth, a second bottom n doped layer overlying the second bottom p doped layer, a second top p doped layer directly overlying the second bottom n doped layer without an intervening layer, and a second top n doped layer overlying the second top p doped layer;
   forming a first shallow trench isolation (STI) region having a maximum STI depth, interposed between the first top n doped layer in the two-photodiode stack and a first n doped vertical column;
   forming a second STI layer having the maximum STI depth, located in a second p well;
   wherein forming the first top p doped layer in the two-photodiode stack includes forming a first top p doped layer having a minimum depth not less than the STI maximum depth; and,
   wherein forming the second top p doped layer in the single photodiode includes forming a second top p doped layer having a minimum depth not less than the STI maximum depth and equal to the depth of the first top p doped layer in the two-photodiode stack.

2. The method of claim 1 wherein forming the second bottom p doped layer in the single photodiode and the first bottom p doped layer in the two-photodiode stack includes:
   simultaneously in concurrent processes, implanting boron to form the two-photodiode stack first bottom p doped layer in a first region of the substrate and the single photodiode second bottom p doped layer in a second region of the substrate; and
   forming the first depth equal to the third depth;
   the method further comprising:
   forming a first p well overlying exterior edges of the two-photodiode stack first bottom p doped layer, surrounding the top and bottom photodiodes and connected to ground; and,
   forming the second p well overlying exterior edges of the single photodiode second bottom p doped layer, surrounding the single photodiode and connected to ground.

3. The method of claim 2 wherein forming the second bottom n doped layer in the single photodiode and the first bottom p doped layer in the two-photodiode stack includes simultaneously forming the first and second bottom n doped layers in the same process using a first mask;
   wherein forming the first top n doped layer in the two-photodiode stack and the second top n doped layer in the single photodiode includes simultaneously forming the first and second top n doped layers in the same process using a second mask; and,
   wherein forming the first top p doped layer in the two-photodiode stack and the second to n doped layer in the single photodiode includes simultaneously forming the first and second top p doped layers in the same process using a third mask.

4. The method of claim 2 further comprising:
   forming the first n doped vertical column adjacent the first p well, extending from the two-photodiode first bottom p doped layer to a stack top surface; and,
   forming a second n doped vertical column adjacent the second p well, extending from the single photodiode second bottom p doped layer to a single photodiode top surface.

5. The method of claim 4 wherein forming the first and second n doped vertical columns includes simultaneously forming the first and second n doped columns in the same process using a fourth mask.

6. The method of claim 2 wherein simultaneously implanting boron to form the first bottom p doped layer in a first region of the substrate and the second bottom p doped layer in a second region of the substrate includes multiple blanket implantations, where higher boron doses are used with higher implantation voltages, to form a dosage gradient in the bottom p doped layers.

7. The method of claim 6 wherein respectively forming the first and second bottom p doped layers of the two-photodiode stack and single photodiode includes:
   a first implantation into the first and second bottom p doped layers at a first voltage level and a first dosage; and,
   a second implantation into the first and second bottom p doped layers with a second voltage level, less that the first voltage level, and a second dosage, less than the first dosage.

8. The method of claim 2 further comprising:
   forming a first transfer transistor overlying the two-photodiode stack connected to the top photodiode;
   forming a second transfer transistor overlying the two-photodiode stack connected to the bottom photodiode; and,
   forming a third transfer transistor overlying the single photodiode.

9. The method of claim 8 wherein forming the first, second, and third transfer transistors includes implanting boron, forming a p doped first surface layer overlying the first top n doped layer of the two-photodiode stack and connected to the first p doped well and ground, forming a p doped second surface layer overlying the first n doped column and connected to the first p doped well and ground, and forming a p doped third surface layer overlying the single photodiode second top n doped layer and second n doped column, and connected to ground.

10. The method of claim 9 wherein forming the first, second, and third transfer transistors includes implanting a dopant selected from a group consisting of As, P, and a combination of As and P, forming an n+ doped floating diffusion first region overlying the first p well, an n+ floating diffusion second region overlying the first p well, and an n+ floating diffusion third region overlying the second p well, wherein the floating diffusion first, second, and third regions are connected together.

11. The method of claim 10 forming the first, second, and third transfer transistors includes:
   forming a first gate electrode overlying and interposed between the floating diffusion first region and the first p doped surface layer;
   forming a second gate electrode overlying and interposed between the floating diffusion second region and the p doped second surface layer; and, forming a third gate electrode overlying and interposed between the floating diffusion third region and the p doped third surface layer.

12. The method of claim 1 wherein forming the two-photodiode stack first bottom p doped layer at the first depth includes forming the first depth in a range of 1400 to 3000 nanometers (nm);

wherein forming the two-photodiode stack first top p doped layer second depth includes forming the second depth in a range of 500 to 1000 nm; and, wherein forming the single photodiode second bottom p doped third depth includes forming the third depth is in a range of 1400 to 3000 nm.

13. The method of claim 7 wherein forming the first depth greater than the third depth includes forming the first depth in a range between 1400 and 3000 nm, and the third depth is less than the first depth.

14. A method for forming a dual-pixel full color complementary metal oxide semiconductor (CMOS) imager, the method comprising:

forming an n doped substrate;

forming a two-photodiode stack including:
    a bottom photodiode with a first bottom p doped layer overlying the substrate at a first depth and a first bottom n doped layer cathode overlying the first bottom p doped layer;
    a top photodiode having a first top p doped layer directly overlying the first bottom n doped layer without an intervening layer, at a second depth, and a first top n doped layer overlying the first top p doped layer;

forming a single photodiode including a second bottom p doped layer overlying the substrate at a third depth, where the third depth is less than, or equal to the first depth, a second bottom n doped layer overlying the second bottom p doped layer, a second top p doped layer directly overlying the second bottom n doped layer without an intervening layer, and a second top n doped layer overlying the second top p doped layer;

wherein respectively forming the first and second bottom p doped layers in the single photodiode and two-photodiode stack includes:
    simultaneously in concurrent processes, implanting boron to form the two-photodiode stack first bottom p doped layer in a first region of the substrate and the single photodiode second bottom p doped layer in a second region of the substrate; and
    forming the first depth equal to the third depth;

the method further comprising:

forming a first p well overlying exterior edges of the two-photodiode stack first bottom p doped layer, surrounding the top and bottom photodiodes and connected to ground;

forming a second p well overlying exterior edges of the single photodiode second bottom p doped layer, surrounding the single photodiode and connected to ground;

forming a first n doped vertical column adjacent the first p well, extending from the two-photodiode first bottom p doped layer to a stack top surface; and, forming a second n doped vertical column adjacent the second p well, extending from the single photodiode second bottom p doped layer to a single photodiode top surface.

15. A method for forming a dual-pixel full color complementary metal oxide semiconductor (CMOS) imager, the method comprising:

forming an n doped substrate;

forming a two-photodiode stack including:
    a bottom photodiode with a first bottom p doped layer overlying the substrate at a first depth and a first bottom n doped layer cathode overlying the first bottom p doped layer;
    a top photodiode having a first top p doped layer directly overlying the first bottom n doped layer without an intervening layer, at a second depth, and a first top n doped layer overlying the first top p doped layer;

forming a single photodiode including a second bottom p doped layer overlying the substrate at a third depth, where the third depth is less than, or equal to the first depth, a second bottom n doped layer overlying the second bottom p doped layer, a second top p doped layer directly overlying the second bottom n doped layer without an intervening layer, and a second top n doped layer overlying the second top p doped layer;

wherein respectively forming the first and second bottom p doped layers in the single photodiode and two-photodiode stack includes:
    simultaneously in concurrent processes, implanting boron to form the two-photodiode stack first bottom p doped layer in a first region of the substrate and the single photodiode second bottom p doped layer in a second region of the substrate; and
    forming the first depth equal to the third depth;

the method further comprising:

forming a first p well overlying exterior edges of the two-photodiode stack first bottom p doped layer, surrounding the top and bottom photodiodes and connected to ground;

forming a second p well overlying exterior edges of the single photodiode second bottom p doped layer, surrounding the single photodiode and connected to ground;

forming a first transfer transistor overlying the two-photodiode stack connected to the top photodiode;

forming a second transfer transistor overlying the two-photodiode stack connected to the bottom photodiode; and, forming a third transfer transistor overlying the single photodiode; and wherein forming the first, second, and third transfer transistors includes implanting boron, forming a p doped first surface layer overlying the first top n doped layer of the two-photodiode stack and connected to the first p doped well and ground, forming a p doped second surface layer overlying the first n doped column and connected to the first p doped well and ground, and forming a p doped third surface layer overlying the single photodiode second top n doped layer and second n doped column, and connected to ground.

* * * * *

UNITED STATES PATENT AND TRADEMARK OFFICE
CERTIFICATE OF CORRECTION

PATENT NO. : 7,816,170 B2  Page 1 of 1
APPLICATION NO. : 12/251067
DATED : October 19, 2010
INVENTOR(S) : Jong-Jan Lee et al.

It is certified that error appears in the above-identified patent and that said Letters Patent is hereby corrected as shown below:

Col. 9, claim 3 should be as follows:

3. The method of claim 2 wherein forming the second bottom n doped layer in the single photodiode and the first bottom p doped layer in the two-photodiode stack includes simultaneously forming the first and second bottom n doped layers in the same process using a first mask;
wherein forming the first top n doped layer in the two-photodiode stack and the second top n doped layer in the single photodiode includes simultaneously forming the first and second top n doped layers in the same process using a second mask; and,
wherein forming the first top p doped layer in the two-photodiode stack and the second top p doped layer in the single photodiode includes simultaneously forming the first and second top p doped layers in the same process using a third mask.

Signed and Sealed this

Seventh Day of December, 2010

David J. Kappos
*Director of the United States Patent and Trademark Office*

UNITED STATES PATENT AND TRADEMARK OFFICE
CERTIFICATE OF CORRECTION

PATENT NO. : 7,816,170 B2  
APPLICATION NO. : 12/251067  
DATED : October 19, 2010  
INVENTOR(S) : Jong-Jan Lee et al.

Page 1 of 1

It is certified that error appears in the above-identified patent and that said Letters Patent is hereby corrected as shown below:

Column 9, line 56 - Column 10, line 3, claim 3 should be as follows:

3. The method of claim 2 wherein forming the second bottom n doped layer in the single photodiode and the first bottom p doped layer in the two-photodiode stack includes simultaneously forming the first and second bottom n doped layers in the same process using a first mask;
wherein forming the first top n doped layer in the two-photodiode stack and the second top n doped layer in the single photodiode includes simultaneously forming the first and second top n doped layers in the same process using a second mask; and,
wherein forming the first top p doped layer in the two-photodiode stack and the second top p doped layer in the single photodiode includes simultaneously forming the first and second top p doped layers in the same process using a third mask.

This certificate supersedes the Certificate of Correction issued December 7, 2010.

Signed and Sealed this  
Twenty-fifth Day of January, 2011

David J. Kappos  
*Director of the United States Patent and Trademark Office*